(12) United States Patent
Van Delft et al.

(10) Patent No.: US 10,249,795 B2
(45) Date of Patent: Apr. 2, 2019

(54) LED CHIP WITH INTEGRATED ELECTROMECHANICAL SWITCH

(71) Applicant: KONINKLIJKE PHILIPS N.V., Eindhoven (NL)

(72) Inventors: Peter Van Delft, Aachen (DE); Theodorus Johannes Petrus Van Den Biggelaar, Aachen (DE); Harald Josef Guenther Radermacher, Aachen (DE); Bob Bernardus Anthonius Theunissen, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 19 days.

(21) Appl. No.: 15/549,363

(22) PCT Filed: Feb. 3, 2016

(86) PCT No.: PCT/EP2016/052282
§ 371 (c)(1),
(2) Date: Aug. 7, 2017

(87) PCT Pub. No.: WO2016/128276
PCT Pub. Date: Aug. 18, 2016

(65) Prior Publication Data
US 2018/0026160 A1   Jan. 25, 2018

(30) Foreign Application Priority Data

Feb. 10, 2015   (EP) .................................... 15154462

(51) Int. Cl.
*H01L 33/00*   (2010.01)
*H01L 33/36*   (2010.01)
(Continued)

(52) U.S. Cl.
CPC .......... *H01L 33/36* (2013.01); *H01H 1/0036* (2013.01); *H01L 27/15* (2013.01); *H01L 33/005* (2013.01); *B81B 2201/01* (2013.01)

(58) Field of Classification Search
CPC ....... H01L 33/36; H01L 33/005; H01L 27/15; H01L 33/0016; H01L 33/02; H01L 33/18; H01H 1/0036; B81B 2201/01
See application file for complete search history.

(56) References Cited

U.S. PATENT DOCUMENTS 6,037,719 A * 3/2000 Yap ......................... G09G 3/22
                                                                    315/169.1
2010/0102336 A1* 4/2010 Lee ....................... H01L 27/153
                                                                       257/88
(Continued)

OTHER PUBLICATIONS

EPO as ISA, "International Search Report and Written Opinion" dated May 4, 2016 from International Application No. PCT/EP2016/052282, filed Feb. 3, 2016, 15 pages.
(Continued)

*Primary Examiner* — Mohsen Ahmadi
*Assistant Examiner* — Wasiul Haider
(74) *Attorney, Agent, or Firm* — Brian D. Ogonowsky; Patent Law Group LLP

(57) ABSTRACT

The invention provides an LED chip having an integrated electrostatic switch for electromechanical control of the LED. A suspended beam switch floats above a conductive control electrode, and by a charging of the electrode may be attracted downward to make connection between an LED structure and an external electrode. Components are mounted on a common substrate so that a fully integrated LED with MEMS switch is formed. Methods for producing the LED chip are further provided, in which production of the switching mechanism is fully integrated with the production of the LED structure.

8 Claims, 5 Drawing Sheets

(51) Int. Cl.
*H01H 1/00* (2006.01)
*H01L 27/15* (2006.01)

(56) References Cited

U.S. PATENT DOCUMENTS

| | | |
|---|---|---|
| 2012/0156820 A1 | 6/2012 | Sangchae |
| 2015/0221820 A1* | 8/2015 | Kim ................... H01L 27/153 257/13 |
| 2016/0240806 A1* | 8/2016 | Gessner ................ B82Y 10/00 |

OTHER PUBLICATIONS

Lee et al., "A New Method of Driving an AMOLED with MEMS switches", IEEE 21st International Conference on Micro Electro Mechanical Systems, Jan. 1, 2008, pp. 132-135.

* cited by examiner

LED CHIP WITH INTEGRATED ELECTROMECHANICAL SWITCH

CROSS-REFERENCE TO RELATED APPLICATIONS

The present application is a § 371 application of International Application No. PCT/EP2016/052282 filed on Feb. 3, 2016 and entitled "LED CHIP WITH INTEGRATED ELECTROMECHANICAL SWITCH," which claims the benefit of European Patent Application No. 15154462.4 filed on Feb. 10, 2015. International Application No. PCT/EP2016/052282 and European Patent Application No. 15154462.4 are incorporated herein.

FIELD OF THE INVENTION

The invention relates to the field of LEDs, in particular to LEDs having integrated switches.

BACKGROUND OF THE INVENTION

After many years of research, there remains a great deal of development on-going within the field of LEDs. The main focus for this development in recent years has been on finding solutions for improved light output or efficiency (increasing the 'lumen-dollar ratio'). However, increasingly, the greatest costs associated with implementing LED technology in lighting applications are incurred by components utilized by driver mechanisms.

One way of reducing these costs is by integrating driver functionalities within LEDs themselves, thereby avoiding the need to manufacture additional external components to fulfill these driver functions. One function in particular which it is often desirable to integrate is the ability to control the ON/OFF state of an LED via a series switch. Integrating a switch within the LED die would eliminate one part of the need for expensive driver components.

A series switch coupled to an LED may for example be used to control the flow of current to that LED, when it forms one channel of a multi-channel system. By applying a pulse width modulation signal to such a switch, the duty cycle with which the LED is operated can be controlled, and accordingly the perceived brightness. In this way, the color of a multi-channel system may for example be controlled by controlling each channel independently.

A parallel switch coupled to an LED may for example be used to selectively bypass an LED. This may for example be used in a tapped linear driver in which LEDs are bypassed in dependence on the level of the rectified AC mains voltage, thereby avoiding the need for an expensive regulated current driver.

One approach to integrating switch functionality is to incorporate a transistor on the LED die. This however requires the provision of additional semiconductor layers within the die having a specific doping, and this increases the costs of producing such an LED.

Desired therefore is means of integrating switching functionality within an LED chip—thereby reducing the need for external driver components for controlling the ON/OFF state of the LED—without the need for providing additional semiconductor layers, as for example would be needed for integrating a transistor within the chip.

SUMMARY OF THE INVENTION

The invention is defined by the claims.

According to an aspect of the invention, there is provided an LED chip, comprising:
  a semiconductor substrate;
  first and second external terminals;
  an LED structure connected between the first and second external terminals;
  a suspended beam electrostatic switch connected in series with the LED structure between the first and second external terminals, or in parallel with the LED structure;
  a third external terminal; and
  a control electrode connected to the third external terminal for controlling the suspended beam electrostatic switch.

There is thus provided an LED chip having an integrated electromechanical switch for providing electrostatic actuation of the LED structure. Both the LED structure and the suspended beam switch are formed on a single common substrate, and the control electrode, by means of which the switch is electrostatically actuated, is internally integrated within the chip. The LED structure may comprise any particular semiconductor layer arrangement by means of which LED functionality is achieved when providing current across the arrangement.

In a series arrangement, the electrostatic switch and the LED structure are in series between the two external terminals, with an internal terminal between them. In a parallel arrangement, the electrostatic switch and the LED structure are in parallel and both connect between the two external terminals.

In the series arrangement, the first external terminal and the internal terminal provide in this instance an anode and cathode (or vice versa) for the LED structure. The first and second external terminals provide the external anode/cathode terminals for the integrated module comprising the LED and its associated switch. The third external terminal acts as control terminal for switching the device between active and inactive states. By applying a voltage to the control electrode, via the third external terminal, the suspended beam becomes electrostatically attracted toward the electrode, and, by consequent displacement downwards, completes the circuit. Where a ground voltage is applied to the control electrode, the suspended beam remains in an idle (suspended) state, with at least one end suspended above one of the switch contacts.

Embodiments of the invention thereby effectively integrate MEMS switch technology into an LED die, providing an external contact (the third external contact) for controlling the MEMS switch, while integrating all other components of the switch into the LED at the chip level. A MEMS switch requires no additional semiconductor layers and specific doping, thereby reducing costs in comparison with, for example, transistor integration. Furthermore, MEMS devices are a mature technology and could be integrated into the LED fabrication process suing standard semiconductor techniques.

The LED structure may comprise (at least) a first semiconductor layer and a second semiconductor layer over the first, each layer having a top surface and a bottom surface, and wherein the second semiconductor layer partially covers the top surface of the first semiconductor layer.

These at least two semiconductor layers—for example an n-doped and a p-doped semiconductor layer—have differing surface areas and are stacked relative to one another such that the upper layer leaves a portion of the lower layer exposed. The two form a 'stepped' structure, such that one portion of the upper surface of the lower layer forms a junction with the upper layer, and a second portion provides a free surface, for, for example, providing a current to the layer.

The first semiconductor layer may comprise two electrically isolated sub-portions, the two isolated by a dividing channel in the semiconductor layer and physically connected at their bottom surfaces by the semiconductor substrate.

The exposed portion of the lower semiconductor layer is thus divided into two separate sub-portions: a first sub-portion partially covered by the upper semiconductor layer, but partially exposed, and a second sub-portion entirely exposed, and isolated electrically from the first sub-portion by the dividing channel. The first sub-portion thus forms the same 'stepped' structure with respect to the upper layer as described above, comprising an exposed lower-layer 'ledge' adjacent to the junction between the two layers, while the second sub-portion forms a separated 'platform' on the other side of the dividing channel.

Within this arrangement, the internal terminal for a series arrangement may be disposed on the top surface of one sub-portion of the lower semiconductor layer, the second external terminal disposed on the top surface of the other sub-portion of the lower semiconductor layer, and the control electrode disposed on a surface within the dividing channel.

For example, according this embodiment, the exposed 'ledge' of the first sub-portion may accommodate the internal contact, the 'platform' formed by the second sub-portion accommodate the second external contact, and the control electrode reside within the dividing channel. The control electrode may thus be disposed at a level lower than the top surface of the lower semiconductor layer.

In one particular embodiment, the suspended beam electrostatic switch may extend across the dividing channel separating the two sub-portions, having one end physically and electrically connected to either the second external terminal or the internal terminal.

The suspended beam switch thus comprises a cantilevered electrode, extending across the dividing channel, elastically hinged at one end, where it makes permanent connection with one of the two contacts bordering the channel. The other end, in its natural (idle) state, is suspended above the other of the two contacts. Since the electrode spans over the top of the channel, by applying a voltage to the control electrode—disposed within the channel—the two electrodes may be electrostatically attracted to one another, and hence the suspended end of the switch brought into contact with its respective electrical contact, and the circuit completed.

In an alternative embodiment, the suspended beam electrostatic switch may comprise a suspended clamp electrode suspended above the dividing channel, being physically connected to, and electrically isolated from, a floating bridge electrode, the bridge electrode having a first end suspended above the internal terminal and a second end suspended above the second external terminal, and wherein both electrodes hinge from a secondary support structure positioned adjacent to the lower layer, spanning across the dividing channel.

The suspended beam switch in this case hinges from a secondary support structure, positioned 'behind' the lower layer, having a height which extends above that of the top surface of the lower semiconductor layer, such that both the clamp electrode and the bridge electrode may float over the semiconductor layer by making physical connection to this raised structure.

The bridge electrode in this case does not span over the top of the dividing channel, but rather circumvents it, extending around the channel instead. In this way, the electrostatic field generated by the control electrode need not interfere with the current passing between the internal contact and the second external contact (and vice versa). Actuation of the switch in this example is facilitated by electrostatic attraction between the control electrode and the suspended clamp electrode, the clamp electrode being electrically isolated from the bridge electrode. The clamp electrode is for example grounded so that it can be attracted to a control electrode, and it may have a connection terminal for this purpose.

The bridge electrode may extend around the channel by passing over the top of the secondary support structure. Due to the physical connection between the bridge electrode and the clamp electrode, electrostatic attraction of the latter also pulls with it the two ends of the bridge electrode, thus completing the circuit between the internal terminal and the second external terminal.

The general MEMS switch design described above in connection with a series switch arrangement may be applied equally to a parallel switch arrangement, with the switch connected electrically between the first and second external terminals and thus in parallel with the LED structure.

According to another aspect of the invention, there is provided a method of producing an LED chip having an integrated electrostatic switch, the method comprising:

providing an LED structure on a semiconductor substrate;

providing first and second external terminals and connecting the LED structure between the two;

providing a suspended beam electrostatic switch in series with the LED structure between the first and second external terminals, or in parallel with the LED structure;

providing a control electrode for controlling the suspended beam electrostatic switch; and providing a third external terminal and connecting said terminal to the control electrode.

Providing the LED structure may comprise providing a first semiconductor layer and a second semiconductor layer over the first, each semiconductor layer having a top surface and a bottom surface, and wherein the second semiconductor layer partially covers the top surface of the first semiconductor layer.

Any means of providing this structure may be implemented. For example, layers may be epitaxially grown, having initially the same surface area, and subsequently a portion of the upper layer removed. Alternatively, the layers may be provided already having this structure, having been formed through a separate process.

The method may further comprise forming a channel between the top and bottom surface of the lower semiconductor layer, thereby providing a lower semiconductor layer having two electrically isolated sub-portions, the two sub-portions connected at their bottom surface by the substrate.

By forming the two isolated sub-portions in this way, processing steps may be minimized, since a separated 'platform' portion—as described above—need not be produced individually. Rather the fabrication of the switching mechanism is fully integrated into the same process flow as the fabrication of the LED chip as a whole, with elements of the switch being formed out of manipulations of the standard semiconductor components which comprise typical LED chip assemblies. This integration may reduce costs, for example, and simplify production as compared with combining separately fabricated MEMS devices with LED chips as external driver components.

Within this arrangement, for a series arrangement, an internal terminal may be provided on the top surface of one sub-portion of the lower semiconductor layer, the second external terminal provided on the top surface of the alternate sub-portion of the lower semiconductor layer, and the control electrode provided on a surface within the dividing channel.

Furthermore, a planarizing layer may in addition be provided within the dividing channel, and the control electrode provided on the planarizing layer.

Such a planarizing layer acts to elevate the level at which the control electrode is disposed, thus reducing the displacement between said electrode and the suspended switch above. A closer separation allows the switch to be actuated with a lower voltage, for example. A planarizing layer, more generally, may simply provide a flat surface upon which to mount the control electrode, should the method of forming the channel leave a non-even surface at its base.

Alternatively, the control electrode may simply be disposed at the bottom of the formed channel, on the exposed portion of the substrate at its base.

Providing the suspended beam electrostatic switch may comprise forming a sacrificial layer over the dividing channel, forming the suspended beam switch over the sacrificial layer, and subsequently removing the sacrificial layer to leave a suspended beam switch, suspended across the dividing channel.

The sacrificial layer allows the 'suspended' or non-actuated shape of the switch to be crafted or formed, by depositing—or otherwise forming—the sacrificial layer in the desired shape, and at the desired height of the final switch. The switch may then be formed over the sacrificial layer, either by molding or otherwise, and finally the sacrificial layer removed to leave the switch in its suspended state.

In one embodiment, forming the switch comprises forming an electrode over the dividing channel, with a first end physically and electrically connected to either the internal contact or the second external contact and second end disposed above the other of the internal contact or second external contact, separated by the sacrificial layer.

According to this embodiment, there is thus created a cantilevered electrode switch, extending across the dividing channel, elastically hinged at one end, where it makes permanent connection with one of the two contacts bordering the channel. The other end, in its natural (idle) state, is suspended above the other of the two contacts.

In an alternate embodiment, forming the switch comprises forming a clamp electrode on the sacrificial layer, positioned above the dividing channel, and forming an electrically isolated but physically connected bridge electrode, having a first end disposed on the sacrificial layer, above the internal terminal, and a second end disposed on the sacrificial layer, above the second external terminal.

Within this embodiment, there may further be formed a secondary support structure, disposed on the substrate, adjacent to the lower layer and spanning across the dividing channel, for providing hinging support for the suspended beam electrostatic switch.

The support structure might, for example, be formed in advance of providing contact terminals, by depositing or forming a layer of planarizing dielectric material over the entire semiconductor layer structure of the chip and subsequently removing—by for example etching—portions of the formed layer, leaving just a portion forming the support structure.

Alternatively, the support structure might be fabricated separately, in advance of the process flow of the present method, or additionally within it, and subsequently mounted to the substrate layer in an appropriate position.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides an LED chip having an integrated electrostatic switch for electromechanical control of the LED. A suspended beam switch floats above a conductive control electrode, and by a charging of the electrode the switch may be attracted downward to make connection between an LED structure and an external electrode or else make connection across the LED structure. Methods for producing the LED chip are further provided, wherein production of the switching mechanism is fully integrated with the production of the LED structure.

Embodiments of the invention thus integrate a MEMS switch device within an LED chip, allowing for ON/OFF control of an LED without the need to provide dedicated external driver components to achieve this function. In contrast to transistor switches, MEMS switches do not require dedicated semiconductor layers, and hence integration within an LED chips is both simpler and cheaper. In particular, by fully integrating the fabrication of both the LED element and the switch element, production of the chip may comprise a fully linear process flow which utilizes substantially similar processes to standard LED fabrication techniques.

Figure 1:
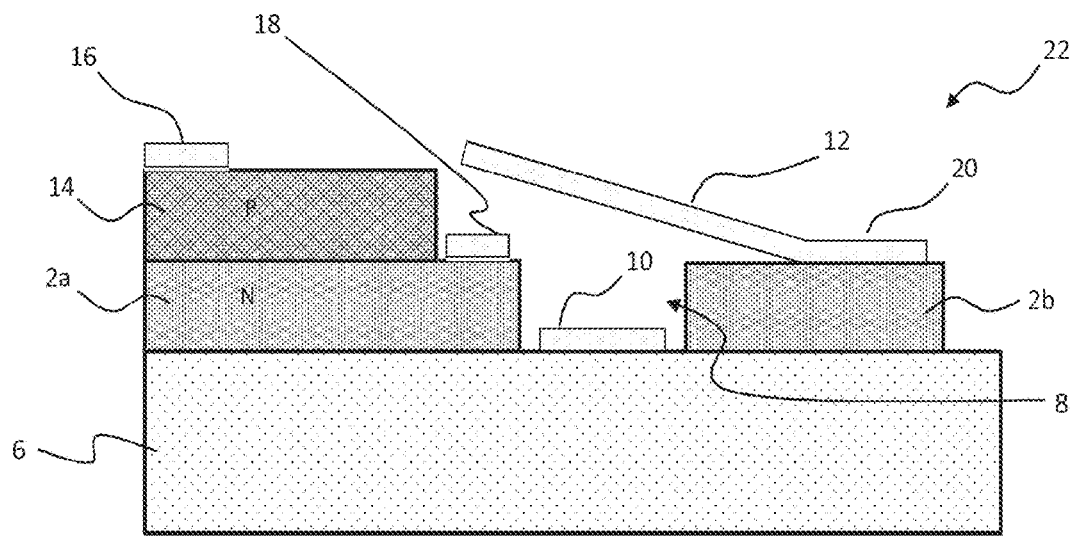
FIG. 1 shows a schematic illustration of a first example embodiment of a LED chip having an integrated electromechanical switch.

FIG. 1 shows a simple first example embodiment of a LED chip in accordance with the invention. A first (lower) semiconductor layer, having two electrically isolated sub-portions 2a, 2b, is disposed on a substrate layer 6. The two subportions are separated by a dividing channel 8 within which is mounted a control electrode 10 for electrostatically attracting a beam switch 12 suspended overhead. Stacked atop the first subportion 2a of the lower semiconductor layer, partially covering its top surface, is a second (upper) semiconductor layer 14. Disposed on the top surface of said upper semiconductor layer 14 is a first external terminal 16. The two semiconductor layers are suitably—and with respect to one another, oppositely—doped such that the two stacked layers form an LED PN junction. On top of an exposed surface of the first lower-layer sub-portion 2a is mounted an internal contact 18, above which floats one end of the suspended beam switch 12. The other end of the suspended beam is physically and electrically connected to a second external terminal 20, the latter mounted on the second sub-portion 2b of the lower semiconductor layer. The first 16 and second 20 external terminals together comprise anode and cathode (or vice versa) connections for the combined LED and switch module.

To the control electrode 10 is attached a third external terminal, for providing to the control electrode an external voltage. On applying a suitable voltage to the control electrode, the suspended beam 12 becomes electrostatically attracted to the electrode, inducing its suspended end to displace downward, and to make contact with internal terminal 18. Electrical connection is then made between first external terminal 16 and the internal terminal 18, thus allowing current to flow between the first 16 and second 20 external terminals, through the LED structure connected between them. Hence the control electrode 10 provides electrostatic actuation of the suspended beam switch 12 and ON/OFF control of the LED chip 22

In the particular example of FIG. 1, the lower layer is shown to comprise an n-doped layer and the upper layer to comprise a p-doped layer. However, it is to be understood that these layers might in alternate embodiments be reversed in terms of their order. In addition, other examples might comprise LED elements having a more complex structure, comprising additional intermediate semiconductor layers, for example.

According to differing examples of this first embodiment, additional non-semiconductive layers may be provided. For example, an isolating or dielectric layer might be applied over the control electrode 10, to isolate the layer conductively from both the two lower layer subportions 2a, 2b surrounding it and the beam switch 12 hanging above. In some examples, this layer might comprise a dielectric layer of SiN. Additionally, by selectively controlling the thickness of such a layer, the separation distance between the control electrode and the beam switch can be controlled. Making the isolation layer thinner will result in a lower control voltage required for actuation of the chip.

Note further, that although in the given example, the first 2a and second 2b lower semiconductor layer subportions are electrically isolated by a dividing channel 8, or separation lane, different methods to achieve this isolation are also possible. For example, the two subportions might be separated by an isolated layer applied atop the lower-layer, or, the second subportion might, for example, comprise a raised portion being electrically isolated by an insulating layer from the remainder of the layer.

In one embodiment, the substrate layer may comprise a sapphire substrate layer, such as a patterned sapphire substrate (PSS). Patterned sapphire substrate LEDs carry the advantage of increased brightness compared with LEDs of more conventional substrate composition. The patterning on the surface of the sapphire substrate reduces the amount of light that is reflected back into the LED upon reaching the substrate boundary, and hence improves the overall brightness of the element. However in alternate embodiments, any suitable material may be used for the substrate in accordance with particular light output or production specifications, and in correspondence with the available technologies at the time of fabrication.

Figure 2:
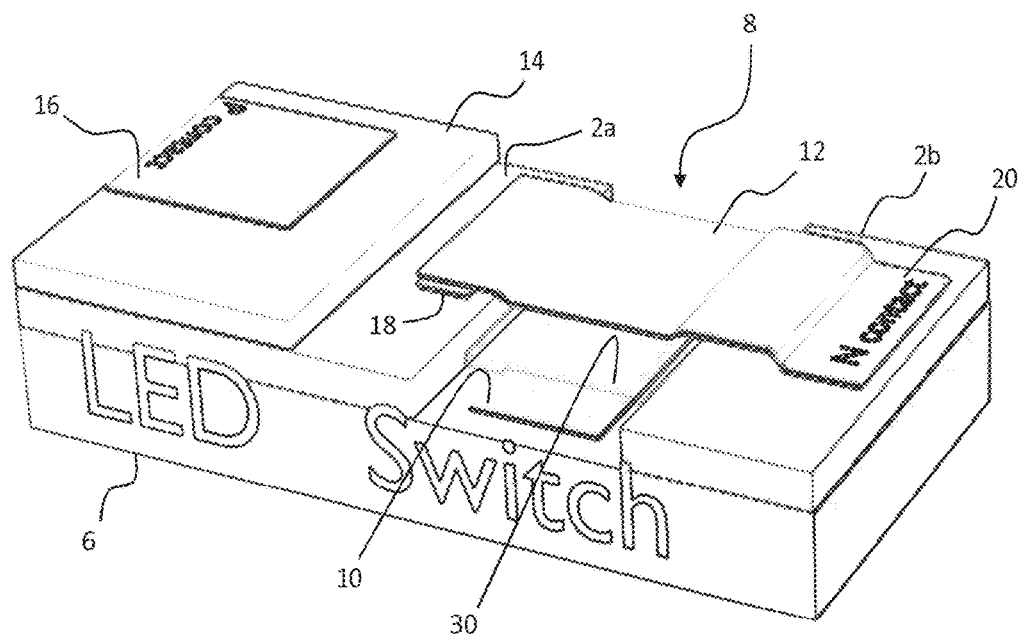
FIG. 2 shows a sketch diagram of the first example embodiment of a LED chip having an integrated electromechanical switch.

In FIG. 2 is shown a sketch diagram of an example of the first embodiment as described above. The control electrode 10 is covered by an isolating dielectric layer 30 and rests in the dividing channel 8 beneath suspended beam 12. The beam spans between the internal terminal 18 mounted to the first lower semiconductor layer subportion 2a, and second external terminal 20—or 'N contact'—mounted to the surface of the second lower layer subportion 2b. First external contact 16—or 'P contact'—is mounted to the surface of the p-doped upper semiconductor layer 14.

While this first embodiment benefits from a very simple design and structure, it also suffers the deficiency that the drive voltage of the LED itself affects the interaction between the control electrode and the suspended beam. Since the drive current is carried by the very same component as is facilitating the electrostatic switching of the chip, the electrostatic action may be affected by the passing current.

To circumvent this, according to a second embodiment of the invention, the suspended beam switch is divided into two separate—and electrically isolated—elements: one for carrying the LED drive current and another for electrostatically interacting with the control electrode.

Figure 3:
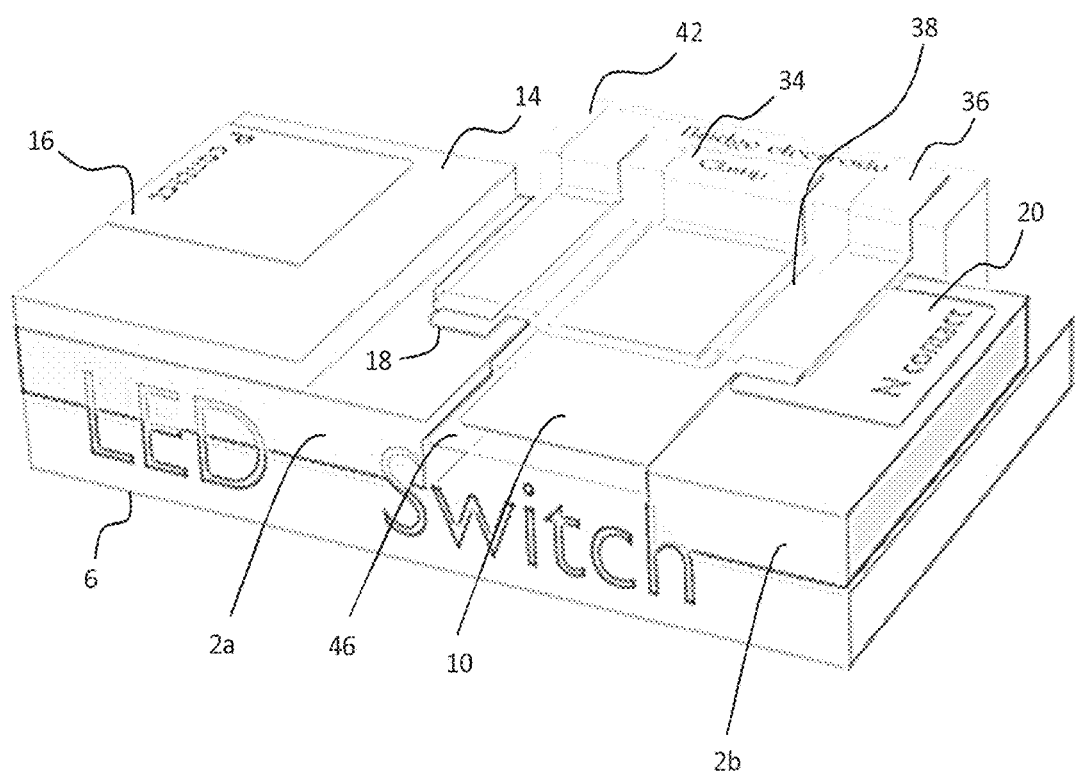
FIG. 3 shows a sketch diagram of a second example embodiment of a LED chip having an integrated electromechanical switch.

In FIG. 3 is shown a sketch diagram of a first example of this second embodiment. According to this example, the suspended beam electrostatic switch 12 comprises a suspended clamp electrode 34 suspended above the dividing channel 8—within which is disposed control electrode 10—and a floating bridge electrode 36, having a first end suspended above the internal terminal 18, and a second end suspended above the second external terminal 20. The suspended clamp electrode is connected to ground by a contact terminal. The two ends of the floating bridge electrode are physically connected to the clamp electrode by a supporting insulating layer 38. Both electrodes are physically attached to a secondary support structure 42, comprised of an insulating material, and positioned 'behind' one end of the dividing channel, mounted to an adjacent portion of the substrate. Both electrodes together comprise the suspended beam switch which 'hinges' from the support structure, so as to float above contacts 18 and 20 when idle, and to deform downwards when actuated.

When a voltage is applied to control electrode 10, clamp electrode 34 is electrostatically attracted, and, due to the physical connecting layer 38, pulls with it bridge electrode 36, whose two ends make contact with internal contact 18 and second external contact 20 respectively, thus completing the circuit across the chip.

Since clamp electrode 34 and bridge electrode 36 are electrically isolated, the drive current of the LED, once the switch is activated, does not interfere with the electrostatic actuation of the switch.

The physical connecting layer may comprise any suitable insulating or dielectric material, such as for example SiN.

In other examples, the embodiment might comprise additional insulating, dielectric or support layers. In one example, the dividing channel 8 is partially filled by a planarizing dielectric layer 46, and the control electrode 10 disposed over said layer. Such a planarizing layer acts to elevate the level at which the control electrode is disposed, thus reducing the displacement between said electrode and the suspended switch above. A closer separation allows the switch to be actuated with a lower voltage, for example. A planarizing layer, more generally, may simply provide a flat surface upon which to mount the control electrode, should the method of forming the channel leave a non-even surface at its base.

Additionally, as in the first embodiment, the control electrode may be covered by a dielectric or insulating layer, of, in one example, SiN, for providing insulation or separation from the clamp electrode 34 above. The thickness of this dielectric layer (or layers) determines the separation distance between the control electrode and the clamp electrode, and hence determine the voltage required for actuation of the switch.

To prevent accidental actuation due to a voltage difference, and hence electrostatic attraction, between the second external contact 20 and the respective over-hanging end of the bridge electrode 36, the surface of the right-hand side of the bridge electrode might, in some examples, have a size which is significantly small, in order to minimize electrostatic forces.

The die-level integration of the LED and electrostatic switch allow for the chip to be constructed using a linear process flow which utilizes substantially similar processes to standard LED fabrication techniques. In particular, the switch component of the chip may be integrated into, and indeed partly fabricated from, simple manipulations of the orthodox semiconductor layer structures which comprise typical LED chips. Furthermore, the modifications to, or additional steps required within, the process flow are typically steps or procedures which are already well known within the field of MEMS device fabrication. Hence, the methods described below constitute merely an integration of fabrication techniques which are well-known within their respective technical fields, and moreover, for which mature technologies and already exist for implementation.

In FIGS. 4*a*-*e* are illustrated stages in a first example process flow for fabrication of a LED chip in accordance with the first embodiment of the invention as described above.

Figure 4A:
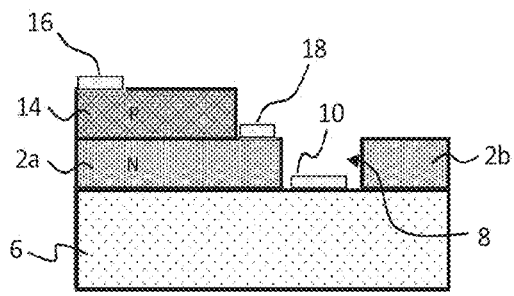
FIGS. 4a-e shows steps in an example method for producing the first example embodiment of a LED chip having an integrated electromechanical switch.

FIG. 4*a* shows the structure after formation of the LED structure but before formation of the MEMS switch. As shown in FIG. 4*a*, a substrate layer 6 is first provided having stacked lower 2*a*, 2*b* and upper 14 semiconductor layers disposed on its surface, the lower semiconductor layer being comprised of two isolated sub-portions 2*a*, 2*b*, separated by a dividing channel 8 wherein the first subportion has a top surface partially covered by the upper layer 14 and the second subportion 2*b* has an exposed top surface. A first external terminal 16 is provided to the surface of the upper semiconductor layer 14 and an internal contact 18 provided to the exposed section of the top surface of the first subportion 2*a* of the lower semiconductor layer. A control terminal 10 is provided within the dividing channel 8 and an external contact terminal (not shown) connected to the control terminal for the application of an external control signal.

In one example, the upper 14 and lower 2*a*, 2*b* semiconductor layers are epitaxially grown on the substrate layer 6 and subsequently shaped by photolithographic etching in situ to form the structure depicted in FIG. 4*a*. For example, the upper and lower semiconductor layer might initially be grown on the substrate 6, each covering the same area of the substrate—the upper layer entirely covering the top surface of the lower layer—and subsequently portions of the layers removed so as to form the structure of FIG. 4*a*. In particular, a portion of the upper semiconductor layer 14 is first removed and subsequently dividing channel 8 is formed through the lower semiconductor layer 2 to form the two isolated lower layer sub-portions 2*a*, 2*b*.

Once the semiconductor layer structure of FIG. 4*a* has been formed, contact terminals 16, 18, 10 are then provided to their respective surfaces. The contacts are formed in situ through controlled deposition and pattering of metal layers at the desired sites for the contacts.

Note that though in the particular example of FIG. 4, the method is shown as comprising providing an n-doped layer below a p-doped layer, in alternate embodiments, these layers might be formed having alternate ordering to create the PN junction. Furthermore in certain embodiments, additional intermediate semiconductor layers might also be provided, for example a multi quantum well stack between the p and n layers.

Figure 4B:
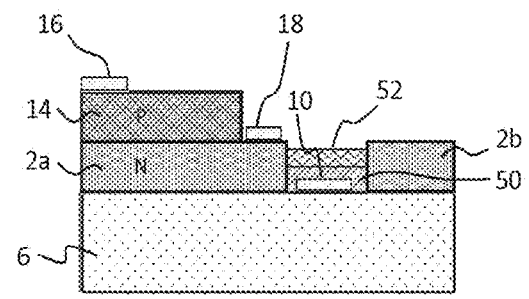

As illustrated in FIG. 4*b*, once the semiconductor layer structure having disposed metal contacts 16, 18, 10 has been provided/formed, two stacked layers are provided within dividing channel 8: a dielectric or insulating layer 50, covering control terminal 10, and a first sacrificial layer 52 atop said first layer 50. The dielectric or insulating layer might be comprised in some examples of, for instance, SiN. The sacrificial layer might be comprised, for example, of $SiO_2$. However, any suitable materials might alternatively be used, wherein the sacrificial layer is comprised of a material which might be easily etched away, while leaving the dielectric layer in place. During one deposition run in the reactor both layers 50,52 can be added sequentially. After these deposition steps the layers are etched.

Figure 4C:
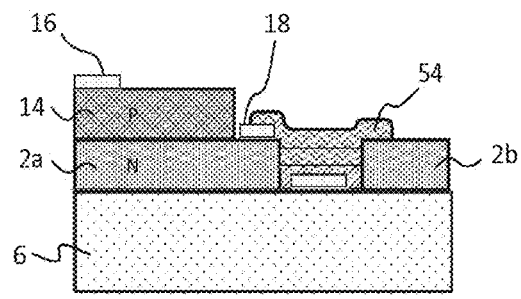

Above the first sacrificial layer 52, a second sacrificial layer 54 is subsequently provided—as illustrated in FIG. 4*c*—this layer extending across the top of dividing channel 8 and at least partially covering the internal terminal 18, and partially covering a section of the top surface of the second subportion 2*b* of the lower semiconductor layer. The second sacrificial layer is then also $SiO_2$ and reaches a height above the height of the contact electrode formed by the internal terminal 18.

Figure 4D:
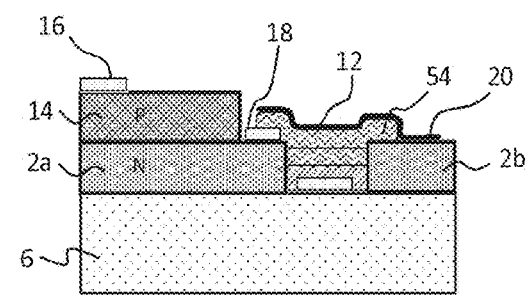

As shown in FIG. 4*d*, atop the second sacrificial layer 54 is formed suspended beam electrode/switch 12. The second sacrificial layer is thus deposited and/or patterned so as to assume across its top surface the particular shape which is desired for the overhanging beam 12. The suspended beam electrode 12 is formed covering the upper surface of the second sacrificial layer 54 and at least partially covering the top surface of second lower layer subportion 2*b*. There is thus formed both the suspended switch and a second external contact 20, the second external contact for the provision of a drive current for the LED, when the chip is in use.

The forming of suspended switch 12 may comprise for example depositing a metal layer across the sacrificial layer 54 and patterning or etching the layer so as to cover only the desired portion of the sacrificial layer 54 and second subportion 2*b*.

Figure 4E:
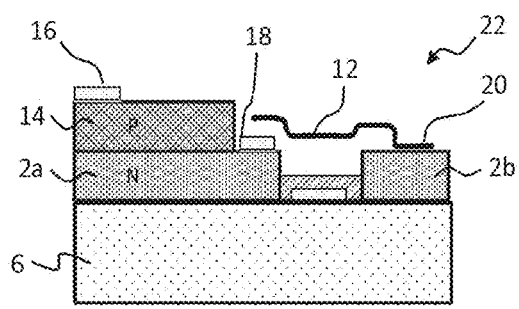

As shown in FIG. 4*e*, once the suspended electrode 12 has been formed, the two sacrificial layers 52, 54 are removed to leave suspended switch 12 physically and electrically connected at one end to a formed second external contact 20, and suspended at the other end above internal contact 18.

The removal of the sacrificial layers might be performed by etching, for example. In the particular case, for instance, that the dielectric layer 50 is provided comprised of SiN, and the sacrificial layers 52, 54 provided comprised of $SiO_2$, the sacrificial layer can be etched away by hydrofluoric acid (vapor/wet etching). SiN is resistant to Hydrofluoric acid and hence will remain after the etching process as a dielectric layer 52 on top of the control electrode, to ensure good isolation.

The example production method depicted by FIGS. 4*a*-*e* (and described above) carries the particular advantage of significant simplicity in terms of the number of separate process steps required, and the number of different materials utilized within the various layers. However, as noted above, the particular embodiment produced by this method carries the disadvantage that the drive voltage of the LED itself affects the actuation behavior of the switch.

Figure 5A:
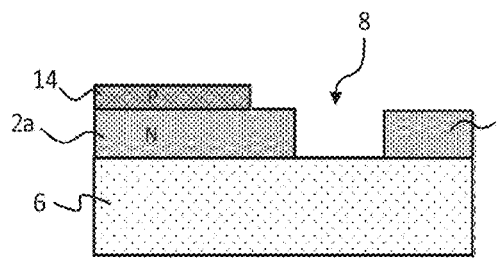
FIGS. 5a-h shows steps in an example method for producing the second example embodiment of a LED chip having an integrated electromechanical switch.

Hence, in FIGS. 5a-h are depicted process steps in an example method for producing the second embodiment of the invention, as described above (and shown in FIG. 3). As shown in FIG. 5a, the method comprises first providing a substrate layer 6 having stacked n and p doped semiconductor layers disposed on its surface, the lower (n-doped) layer 2a, 2b being split by a dividing channel 8 into two isolated sub-portions, the first sub-portion 2a is partially covered by the upper semiconductor layer 14 and the second sub-portion 2b has an exposed upper surface. Thus, the method is again described after the conventional formation of the LED structure.

Figure 5B:
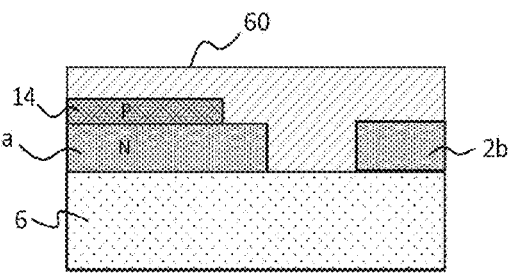
Figure 5C:
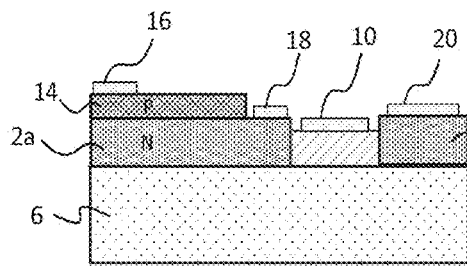

FIG. 5b shows the next stage of the method, wherein the semiconductor layer structure of FIG. 5a is covered or 'filled' by a planarizing dielectric layer 60. The planarizing dielectric layer might, in one example, comprise a layer of Benzocyclobutene, but might in other examples comprise different materials. The planarizing dielectric layer is subsequently patterned and etched back so as to partly fill the dividing channel 8 as shown in FIG. 5c. Also formed through said patterning and etching process is a secondary support structure 42 (not shown in FIG. 5, for the sake of clarity, but shown in the FIG. 3 depiction of the second embodiment of the invention) disposed on a portion of the substrate 6 'behind' the layer structure depicted in FIG. 5c, adjacent to one end of the dividing channel 8 and spanning between the two lower semiconductor layer subportions 2a, 2b.

After etching/patterning of the planarizing dielectric layer 60, external and internal contact terminals 16, 18, 20 are provided to respective surfaces of the semiconductor layers, and control terminal 10 is provided to the top surface of the planarizing dielectric layer disposed within the dividing channel. A third external terminal (not shown) is also provided, connected with the control terminal, for delivery of an external voltage. As in the first example production method, these terminals are typically formed in situ by deposition and patterning.

Figure 5D:
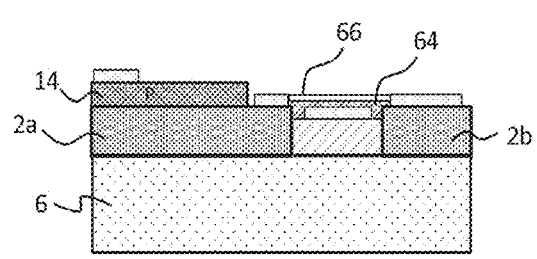

Once contact terminals are provided—as shown in FIG. 5d—a layer of dielectric material 64 is provided, covering the control terminal 10, and atop the dielectric layer, a first sacrificial layer 66 is provided, the two layers provided having combined thickness such that the top surface of the first sacrificial layer aligns with the top surfaces of neighboring contact terminals 18 and 20. This alignment of the electrodes is, however, optional. The sacrificial layer might comprise, in some examples a layer of $SiO_2$. However, the skilled person would appreciate that other such materials exist for the composition of a sacrificial layer. The dielectric layer 64 serves to provide electrical isolation of the clamp electrode.

Figure 5E:
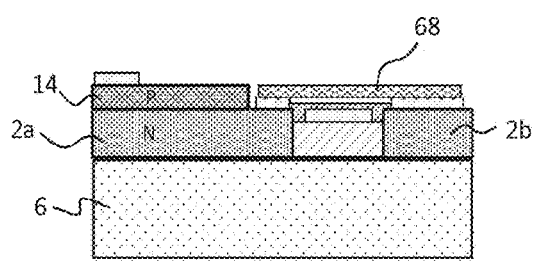

As depicted in FIG. 5e, a second sacrificial layer 68 is subsequently deposited, covering the entirety of the top surfaces of internal terminal 18 and second external terminal 20, and extending across the top the first sacrificial layer 66, to cover the dividing channel 8.

Figure 5F:
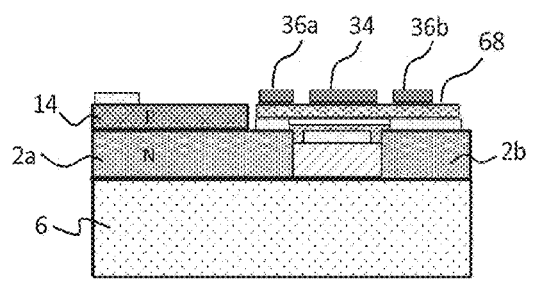

With the second sacrificial layer 68 in place, the metal components of the suspended beam switch are subsequently formed. As described above, the suspended beam switch, in the second example embodiment of the invention (see FIG. 3), comprises electrically isolated bridge electrode 36, and clamp electrode 34. The bridge electrode has a first end 36a suspended above the internal terminal and a second end 36b suspended above the second external terminal. The clamp electrode 34 physically floats above the dividing channel 8 and the control electrode 10 disposed therein. As shown in FIG. 3, both the bridge electrode 36 and the clamp electrode 34 are physically connected with the secondary support structure 42, with the bridge electrode spanning between the two lower layer sub-portions 2a, 2b via the top surface of the secondary support structure. Hence in the formation of the bridge electrode and the clamp electrode, as illustrated by FIG. 5f, a first metal layer is deposited (and patterned), extending 'backward' from first end terminal 36a to the secondary support structure behind (not shown), across the top surface of the support structure, and 'forwards' again, to form second end terminal 36b. Between the two end terminals, is formed clamp electrode 34, which extends 'backward' to make physical contact with support structure 42, but without making physical contact with the deposited bridge electrode 36.

Figure 5G:
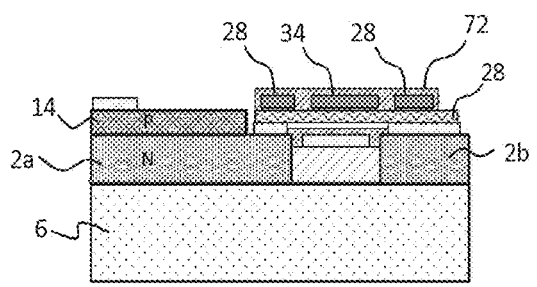
Figure 5H:
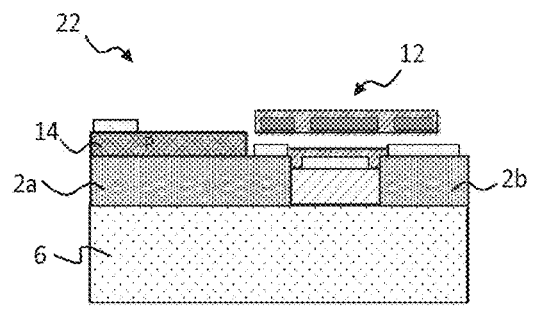

Upon forming metal contact elements 36a, 36b, 34, these elements are covered by a dielectric layer 72 (see FIG. 5g). The dielectric layer acts to physically bind the three contact points together, so as to form a unified suspended beam switch structure 12 which moves as a single entity.

After deposition (or other application) of this dielectric layer, the first and second sacrificial layers 66, 68 are removed (see FIG. 5h) by, for example, etching, leaving the clamp 34 and bridge 36 electrodes suspended above the internal and second external terminals, and the control electrode respectively.

When using a MEMS actuator for switching, sealing the device is important for ensuring a proper functioning of the device, and for maximizing lifetime. Hence, according to a number of embodiments, the LED chip may be encased within an encapsulation arrangement. Several techniques exist within the field of electronic packaging which can hermetically seal sensitive parts of electrical devices.

Figure 6:
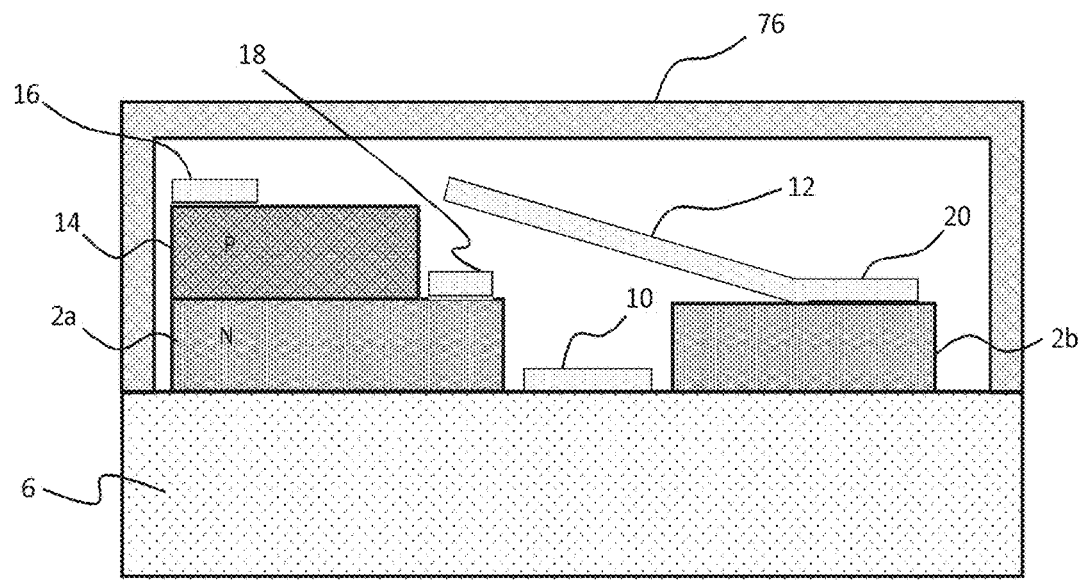
FIG. 6 shows an example embodiment of an encapsulated LED chip having an integrated electromechanical switch.

FIG. 6 shows a simple example of such an arrangement in which the apparatus comprising the first above described embodiment of a LED chip is encased within a capping structure 76 which hermetically seals the components of the device from the surrounding environment. The capping structure might be formed of glass, and in some examples might additionally be covered by a phosphor so as to create a white light LED. Where sealing the apparatus in this way, the connections to first, second and third external terminals will need to be routed outside of the seal. Other methods for encapsulating LED chips may also be considered.

The example above creates an LED module comprising an LED and a series switch. There may be multiple LEDs in series within each chip. The switch may instead be in parallel with the LED and the same basis processing approach may be applied.

For example, a parallel architecture may be formed by using the contacts 16,18 as the external anode and cathode terminals, and electrically connecting the contacts 16 and 20 together. In this way the diode is between external contact 18 and 16 (=20), and the switch is also between external contacts 18 and 16 (=20). The electrode 18 in this case needs to be made larger so that it can function both as an external terminal and also as a contact terminal for the electrostatic beam.

Thus, the same structure but with one additional internal connection, can be used to form a parallel arrangement.

In another arrangement, all three contacts 16, 18, 20 can be provided as external terminals, and external interconnections may then determine whether the switch is coupled as a series switch or a parallel switch. The overall module will then have four external terminals.

Of course, other different designs may be used for the series version and for the parallel version. To avoid sharing electrodes, the LED and the switch may be entirely independent within the chip, with five external terminals—two for the LED three for the switch. External connections made can then determine whether the components are in series or in parallel.

Figure 7:
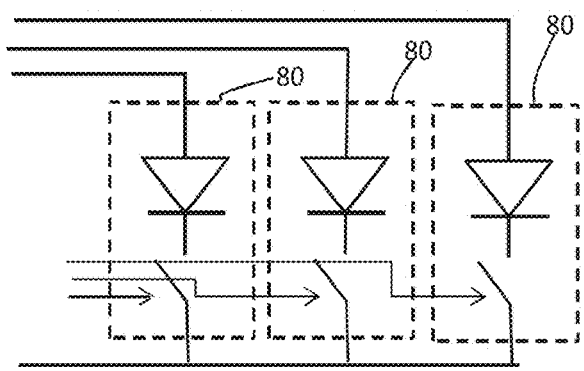
FIG. 7 shows a first possible use of LED modules each with a series switch.

FIG. 7 shows one possible use of LED modules with integrated series switches. There are three modules shown in parallel. Each module 80 provides a different color output such as red, green and blue, or white, cool white and warm white. Each color functions as a channel, and the switches are controlled, for example with PWM (pulse width modulation) signals to control the light contribution from each channel.

Figure 8:
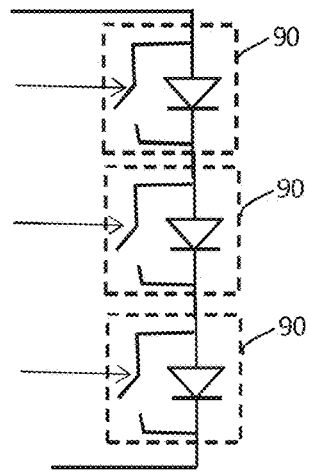
FIG. 8 shows a first possible use of LED modules each with a parallel switch.

FIG. 8 shows one possible use of LED modules with integrated parallel switches. There are three modules 90 shown in series. The parallel switches control how many modules are in circuit. The number of modules used can be selected in dependence on the rectified mains signal level, thereby simplifying the driver needed. The switches are thus controlled in synchronism with a rectified mains voltage signal.

There are other circuits which may make use of series or parallel switches associated with the LEDs.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An LED chip, comprising:
   a semiconductor substrate;
   first and second external terminals;
   an LED structure connected between the first and second external terminals, the LED structure comprising a first semiconductor layer and a second semiconductor layer over the first semiconductor layer, each layer having a top surface and a bottom surface;
   a suspended beam electrostatic switch connected in series with the LED structure between the first and second external terminals, or in parallel with the LED structure;
   a third external terminal;
   a control electrode connected to the third external terminal for controlling the suspended beam electrostatic switch,
   the first semiconductor layer comprising two electrically isolated sub-portions isolated by a dividing channel in the first semiconductor layer and physically connected at their bottom surfaces by the semiconductor substrate,
   the second semiconductor layer partially covering the top surface of the first semiconductor layer,
   an internal terminal being connected to an anode or cathode of the LED structure and disposed on the top surface of one sub-portion of the first semiconductor layer, and
   the second external terminal being disposed on the top surface of the other sub-portion of the first semiconductor layer, and the control electrode being disposed on a surface within the dividing channel,
   wherein the suspended beam electrostatic switch extends across the dividing channel separating the two sub-portions, having one end physically and electrically connected to either the second external terminal or the internal terminal.

2. An LED chip, comprising:
   a semiconductor substrate;
   first and second external terminals;
   an LED structure connected between the first and second external terminals, the LED structure comprising a first semiconductor layer and a second semiconductor layer over the first semiconductor layer, each layer having a top surface and a bottom surface;
   a suspended beam electrostatic switch connected in series with the LED structure between the first and second external terminals, or in parallel with the LED structure;
   a third external terminal;
   a control electrode connected to the third external terminal for controlling the suspended beam electrostatic switch,
   the first semiconductor layer comprising two electrically isolated sub-portions isolated by a dividing channel in the first semiconductor layer and physically connected at their bottom surfaces by the semiconductor substrate,
   the second semiconductor layer partially covering the top surface of the first semiconductor layer,
   an internal terminal being connected to an anode or cathode of the LED structure and disposed on the top surface of one sub-portion of the first semiconductor layer, and
   the second external terminal being disposed on the top surface of the other sub-portion of the first semiconductor layer, and the control electrode being disposed on a surface within the dividing channel,
   wherein the suspended beam electrostatic switch comprises a suspended clamp electrode suspended above the dividing channel, being physically connected to, and electrically isolated from, a floating bridge electrode, the bridge electrode having a first end suspended above the internal terminal and a second end suspended above the second external terminal, and both electrodes hinge from a secondary support structure positioned adjacent to the lower semiconductor layer, spanning across the dividing channel.

3. A method of producing an LED chip having an integrated electrostatic switch, the method comprising:
   providing an LED structure on a semiconductor substrate, comprising providing a first semiconductor layer and a second semiconductor layer over the first semiconductor layer, each semiconductor layer having a top surface and a bottom surface, and the second semiconductor layer partially covers the top surface of the first semiconductor layer;
   providing first and second external terminals and connecting the LED structure between the two;
   forming a channel between the top and bottom surface of the first semiconductor layer, thereby providing a first semiconductor layer having two electrically isolated sub-portions, the two sub-portions connected at their bottom surface by the substrate;
   providing a suspended beam electrostatic switch in series with the LED structure between the first and second external terminals, or in parallel with the LED structure;
   providing a control electrode for controlling the suspended beam electrostatic switch;

providing a third external terminal and connecting said terminal to the control electrode; and providing an internal terminal on the top surface of one sub-portion of the first semiconductor layer, wherein the suspended beam electrostatic switch extends across the two sub-portions, having one end physically and electrically connected to either the second external terminal or the internal terminal, the second external terminal being provided on the top surface of the alternate sub-portion of the first semiconductor layer, and the control electrode being provided on a surface within the dividing channel.

4. A method as claimed in claim 3, further comprising providing a planarizing layer within the dividing channel, and the control electrode being provided on the planarizing layer.

5. A method of producing an LED chip having an integrated electrostatic switch, the method comprising:

providing an LED structure on a semiconductor substrate, comprising providing a first semiconductor layer and a second semiconductor layer over the first semiconductor layer, each semiconductor layer having a top surface and a bottom surface, and the second semiconductor layer partially covers the top surface of the first semiconductor layer;

providing first and second external terminals and connecting the LED structure between the two;

forming a channel between the top and bottom surface of the first semiconductor layer, thereby providing a first semiconductor layer having two electrically isolated sub-portions, the two sub-portions connected at their bottom surface by the substrate;

providing a suspended beam electrostatic switch in series with the LED structure between the first and second external terminals, or in parallel with the LED structure;

providing a control electrode for controlling the suspended beam electrostatic switch;

providing a third external terminal and connecting said terminal to the control electrode; and providing an internal terminal on the top surface of one sub-portion of the first semiconductor layer, the second external terminal being provided on the top surface of the alternate sub-portion of the first semiconductor layer, and the control electrode being provided on a surface within the dividing channel, wherein providing the suspended beam electrostatic switch comprises forming a sacrificial layer over the dividing channel, forming the suspended beam switch over the sacrificial layer, and subsequently removing the sacrificial layer to leave a suspended beam switch, suspended across the dividing channel.

6. A method as claimed in claim 5, wherein forming the switch comprises forming an electrode over the dividing channel, with a first end physically and electrically connected to either the internal terminal or the second external contact and a second end disposed above the other of the internal terminal or second external terminal, separated by the sacrificial layer.

7. A method as claimed in claim 6, wherein forming the switch comprises forming a clamp electrode on the sacrificial layer, positioned above the dividing channel, and forming an electrically isolated but physically connected bridge electrode, having a first end disposed on the sacrificial layer, above the internal terminal, and a second end disposed on the sacrificial layer, above the second external terminal.

8. A method as claimed in claim 7, further comprising forming a secondary support structure, disposed on the substrate, adjacent to the first semiconductor layer and spanning across the dividing channel, for providing hinging support for the suspended beam electrostatic switch.

* * * * *